United States Patent
Naruse et al.

(10) Patent No.: US 9,247,677 B2
(45) Date of Patent: Jan. 26, 2016

(54) ELECTRONIC COMPONENT CASING

(75) Inventors: Mikio Naruse, Isehara (JP); Takaya Ishii, Yokohama (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 381 days.

(21) Appl. No.: 13/698,843

(22) PCT Filed: Apr. 20, 2011

(86) PCT No.: PCT/JP2011/059689
§ 371 (c)(1),
(2), (4) Date: Nov. 19, 2012

(87) PCT Pub. No.: WO2011/145421
PCT Pub. Date: Nov. 24, 2011

(65) Prior Publication Data
US 2013/0063880 A1    Mar. 14, 2013

(30) Foreign Application Priority Data
May 21, 2010    (JP) ................................ 2010-117472

(51) Int. Cl.
H05K 7/20    (2006.01)

(52) U.S. Cl.
CPC .......... *H05K 7/20845* (2013.01); *H05K 7/2089* (2013.01); *H05K 7/20409* (2013.01); *H05K 7/20854* (2013.01); *H05K 7/20863* (2013.01)

(58) Field of Classification Search
CPC .......................... H05K 7/2089–7/20918; H01L 23/367–23/3675
USPC ........ 361/679.46–679.54, 688–723; 312/236; 363/141; 174/547–548; 165/80.1–80.3
See application file for complete search history.

(56) References Cited

U.S. PATENT DOCUMENTS

| | | | | |
|---|---|---|---|---|
| 6,065,530 | A | * | 5/2000 | Austin et al. ................. 165/80.3 |
| 6,067,229 | A | * | 5/2000 | Johnson et al. ............... 361/704 |
| 6,905,361 | B2 | * | 6/2005 | Dorrhofer .......... H05K 7/20854 439/485 |
| 7,167,057 | B2 | * | 1/2007 | Dieterich ................ H01P 5/107 331/107 DP |
| 2003/0161110 | A1 | * | 8/2003 | Spasevski .......... H05K 7/20854 361/715 |
| 2009/0206662 | A1 | * | 8/2009 | Kakuda et al. .................. 307/11 |
| 2011/0011641 | A1 | * | 1/2011 | Pfeffer .......................... 174/547 |
| 2011/0214897 | A1 | * | 9/2011 | Yoshida ............ H05K 7/20918 174/50.51 |
| 2012/0055721 | A1 | * | 3/2012 | Matano ........................ 180/65.1 |
| 2013/0278194 | A1 | * | 10/2013 | Numakura ............... 318/400.27 |
| 2013/0306387 | A1 | * | 11/2013 | Katano et al. .............. 180/65.31 |

FOREIGN PATENT DOCUMENTS

| | | | |
|---|---|---|---|
| JP | 61-030414 | A | 2/1986 |
| JP | 6-245542 | A | 9/1994 |
| JP | 10-135672 | A | 5/1998 |
| JP | 2002-185173 | A | 6/2002 |
| JP | 2002-280777 | A | 9/2002 |
| JP | 2004-196134 | * | 7/2004 |
| WO | WO 2010119320 | A1 * | 10/2010 |

OTHER PUBLICATIONS

"Toyota Prius New Model Guide, NHW20 Series", 1.2 Hybrid System THS II P1-26, Toyota Motor, Corporation, Sep. 2003, (2 pages).
Supplementary European Search Report dated Dec. 17, 2014, 6 pgs.

* cited by examiner

*Primary Examiner* — Zachary M Pape
(74) *Attorney, Agent, or Firm* — Foley & Lardner LLP

(57) ABSTRACT

An electronic component casing includes: an inclined portion that projects from an upper surface so as to increase in height gradually from one side; a step portion that descends as a continuation of an upper end of the inclined portion or descends via a plane connected to the upper end; and a planar portion connected to a lower end of the step portion.

8 Claims, 11 Drawing Sheets

ELECTRONIC COMPONENT CASING

TECHNICAL FIELD

This invention relates to a structure of an electronic component casing.

BACKGROUND ART

"Toyota Prius New Model Guide, NHW20 Series", published in September 2003 by Toyota Motor Corporation, discloses a casing that houses a vehicle inverter. An upper surface of the casing disclosed therein increases in height gradually rearward from a vehicle front, and then gradually decreases in height after reaching a peak.

SUMMARY OF THE INVENTION

The inverter housed in the casing generates heat. Therefore, heat accumulates in the casing. The inventors found that, in this case, when the casing is shaped as described above, a laminar flow of air flows along the upper surface of the casing on a periphery of the casing, causing a heat radiation effect of the casing to deteriorate.

This invention has been designed with an emphasis on solving this problem in the background art, and an object of this invention is to provide an electronic component casing that can discharge heat generated by an electronic component housed therein efficiently.

According to an aspect of this invention, an electronic component casing including: an inclined portion that projects from an upper surface so as to increase in height gradually from one side; a step portion that descends as a continuation of an upper end of the inclined portion or descends via a plane connected to the upper end; and a planar portion connected to a lower end of the step portion, is provided.

Embodiments and advantages of this invention will be described in detail below together with the attached figures.

EMBODIMENTS OF THE INVENTION (First Embodiment)

Figure 1:
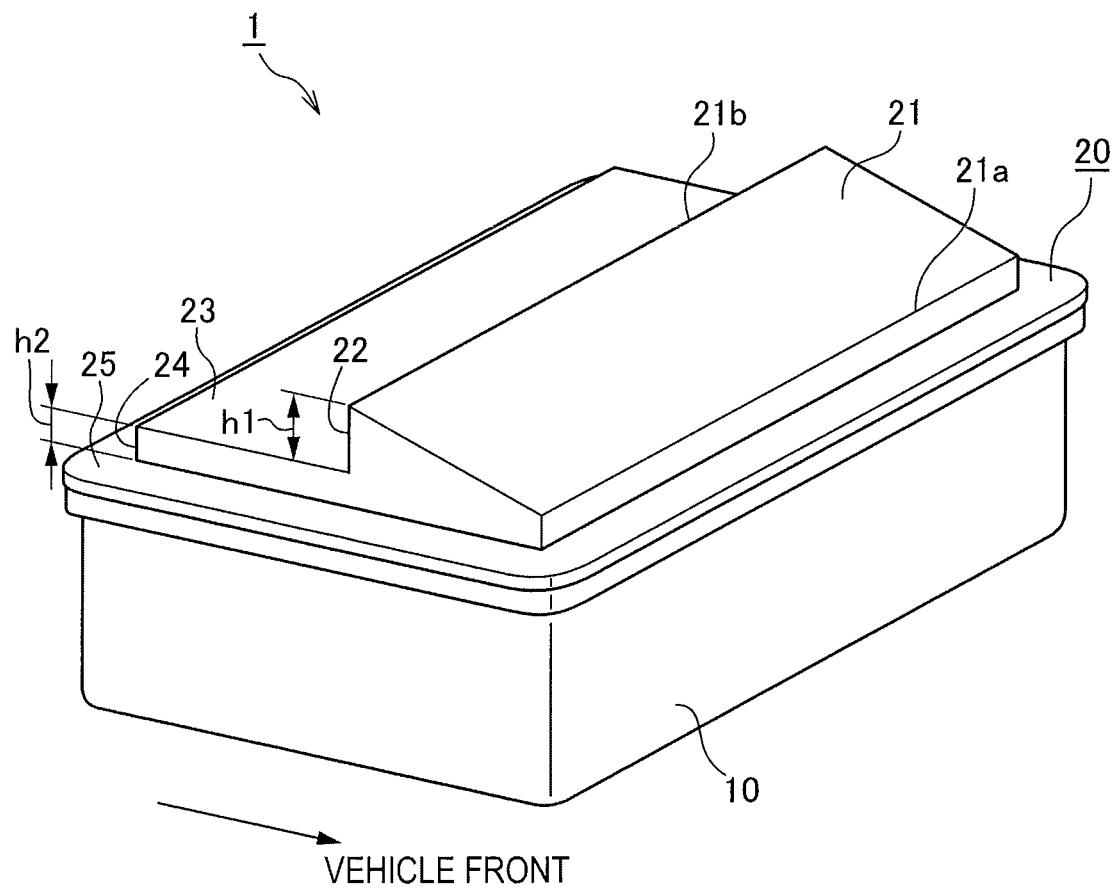
FIG. 1 is a perspective view showing a first embodiment of an electronic component casing according to this invention.

FIG. 1 is a perspective view showing a first embodiment of an electronic component casing according to this invention.

Figure 2:
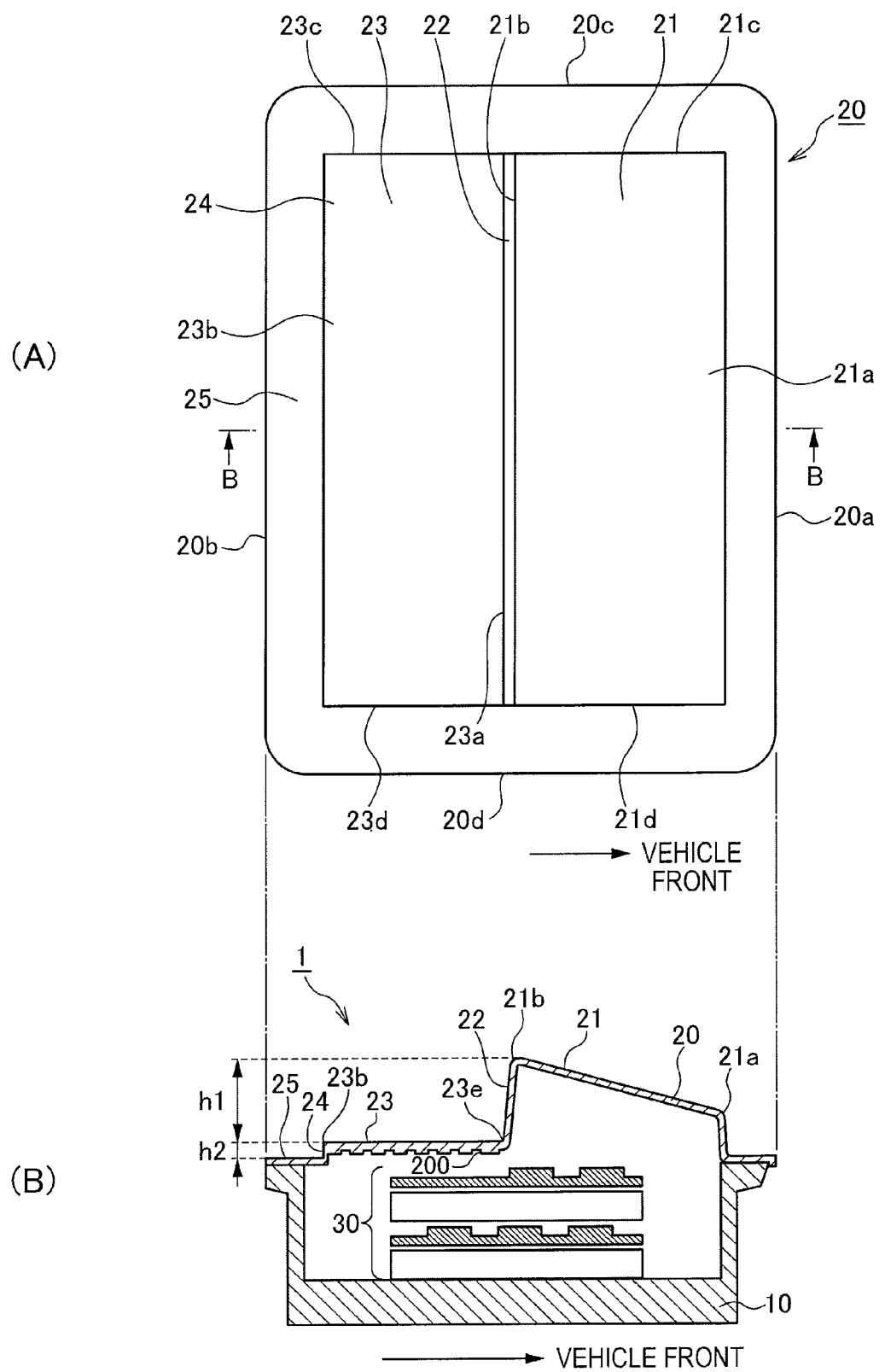
FIG. 2 is a view showing the first embodiment of the electronic component casing according to this invention.
Figure 3:
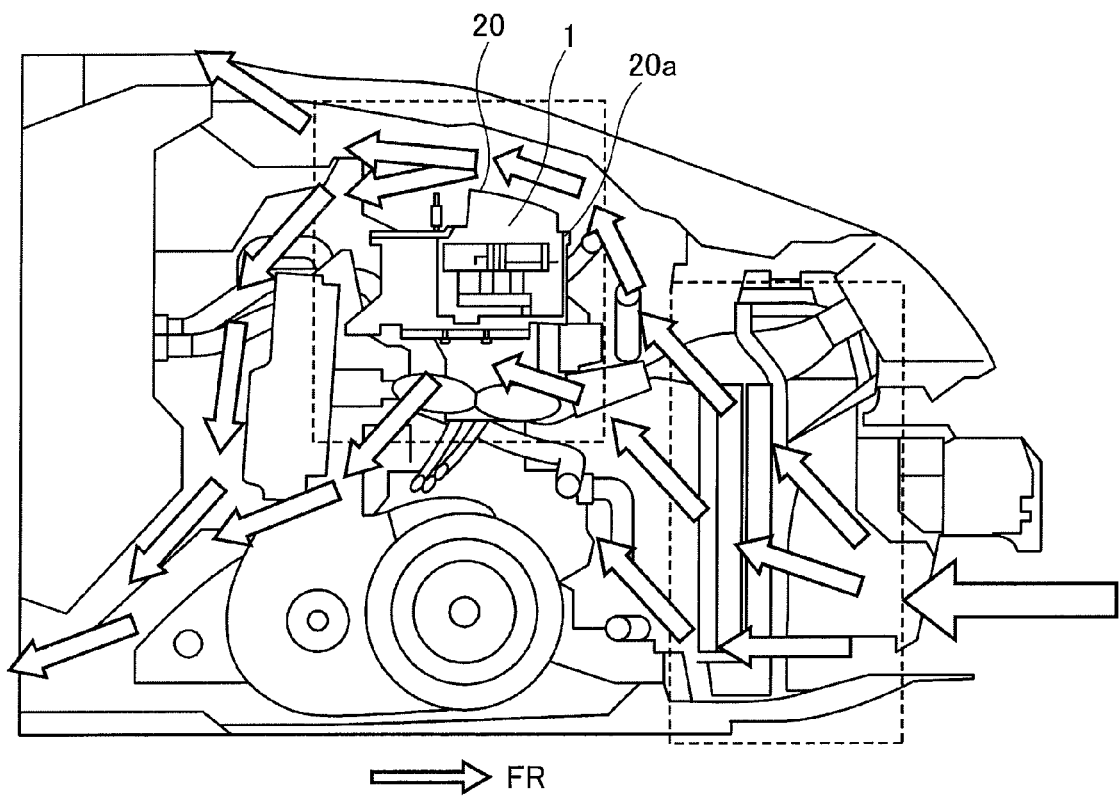
FIG. 3 is a view illustrating air flowing around the electronic component casing during vehicle travel.

An electronic component casing 1 is disposed in an engine room or a motor room (see FIG. 3). The electronic component casing 1 includes a case 10 and a lid 20. The electronic component casing 1 houses an electronic component 30 (see FIG. 2). The electronic component casing 1 forms a tight seal around the electronic component 30. The electronic component casing 1 protects the housed electronic component from external missiles, physical pressure, and infiltration of contamination (small foreign particles) and water. The electronic component casing 1 also shields the electronic component from electromagnetic waves.

The case 10 is fixed to a vehicle (see FIG. 3). The electronic component 30 is fixed to a bottom of the case 10 (see FIG. 2). The electronic component 30 includes a semiconductor element, a circuit, and so on. For example, the electronic component 30 is an inverter. This type of electronic component 30 generates heat. Since the electronic component 30 is housed so as not to project from the case 10, the heat accumulates easily. To enable the heat to escape easily, the case 10 is preferably formed from a material possessing thermal conductivity. Hence, in this embodiment, the case 10 is formed from an aluminum alloy die cast material.

The lid 20 is placed on the case 10. The lid 20 closes an opening in the case 10. In this embodiment, the lid 20 corresponds to an upper surface of the electronic component casing 1. The lid 20 is also formed from an aluminum alloy die cast material. An upper surface of the lid 20 includes an inclined portion 21, a planar portion 23, and a reference plane 25. In other words, the lid 20 forms a projection relative to the reference plane 25.

The inclined portion 21 is a part that inclines so as to increase in height from a long side 21a. An upper end side of the inclined portion 21 serves as a long side 21b.

The planar portion 23 is connected to the long side 21b of the inclined portion 21 via a step portion 22. Further, the planar portion 23 is connected to the reference plane 25 via an additional step portion 24. The planar portion 23 is lower than the long side 21b of the inclined portion 21 and higher than the reference plane 25. A distance from the planar portion 23 to the long side 21b of the inclined portion 21, or in other words a height h1 of the step portion 22, is greater than a distance from the reference plane 25 to the planar portion 23, or in other words a height h2 of the additional step portion 24. In other words, "h1>h2" is established.

The reference plane 25 is a surface serving as a reference for the upper surface of the lid 20. In this embodiment, the reference plane 25 extends around a peripheral edge of the lid 20.

The step portion 22 is a part that descends from an upper end of the inclined portion 21 to the planar portion 23.

The additional step portion 24 is a step that descends further from the planar portion 23 to the reference plane 25.

FIG. 2 is a view showing the first embodiment of the electronic component casing according to this invention, wherein FIG. 2A is a plan view and FIG. 2B is a B-B sectional view of FIG. 2A.

As shown in FIG. 2A, the lid 20, when seen from above, takes a rectangular shape constituted by long sides 20a, 20b and short sides 20*c*, 20*d*. The inclined portion 21 and the planar portion 23 sandwich the step portion 22, which is substantially in a center of the lid 20, from the right and the left, respectively.

The inclined portion 21, when seen from above, takes a rectangular shape constituted by long sides 21*a*, 21*b* and short sides 21*c*, 21*d*. The long sides 21*a*, 21*b* are parallel to the long sides 20*a*, 20*b* of the lid 20. The short sides 21*c*, 21*d* are parallel to the short sides 20*c*, 20*d* of the lid 20.

The planar portion 23 is connected to the long side 23*a* via a step portion. When seen from above, the planar portion 23 takes a rectangular shape constituted by long sides 23*a*, 23*b* and short sides 23*c*, 23*d*. The long sides 23*a*, 23*b* are parallel to the long sides 20*a*, 20*b* of the lid 20. The short sides 23*c*, 23*d* are parallel to the short sides 20*c*, 20*d* of the lid 20. Further, the short side 23*c* is located on an extension of the short side 21*c* of the inclined portion 21, while the short side 23*d* is located on an extension of the short side 21*d* of the inclined portion 21.

As shown in FIG. 2B, the electronic component 30 is fixed to the bottom of the case 10. The electronic component 30 generates heat in accordance with an amount of electricity. Therefore, to allow the heat generated by the electronic component 30 to escape, the case 10 is preferably formed from a material possessing thermal conductivity. Hence, in this embodiment, the case 10 is formed from an aluminum alloy die cast material. It should be noted that a coolant flow passage may be provided in the bottom of the case 10. The presence or absence of a coolant passage in the case 10, the material of the case 10, specifications thereof, and so on may be determined appropriately in accordance with an amount of heat generated by the electronic component 30.

The inclined portion 21 and so on project from the lid 20, and therefore a space is secured between the lid 20 and the electronic component 30. Further, irregularities 200 are formed parallel to the long side 23*a* in a rear side of the planar portion 23 of the lid 20. The planar portion 23 has a low position and is therefore close to the electronic component 30. By forming the irregularities 200 in the planar portion 23, the heat generated by the electronic component 30 can be transferred easily.

FIG. 3 is a view illustrating air flowing around the electronic component casing during vehicle travel.

The electronic component casing 1 is installed in the vehicle such that the long side 20*a* of the lid 20 is located at the front of the vehicle.

During vehicle travel, air is taken into the engine room or the motor room through a front grille. The air passes through a radiator, flows through an interior of the engine room or the motor room toward the rear of the vehicle, as shown by arrows, and then flows out to the exterior from the rear of a hood and the bottom of a floor panel. At this time, components disposed in the engine room or the motor room are cooled. The electronic component casing 1 according to this embodiment is likewise disposed in the engine room or the motor room. Hence, during vehicle travel, the air taken in through the front grille flows around the electronic component casing 1. This will now be described in further detail with reference to FIG. 4.

Figure 4:
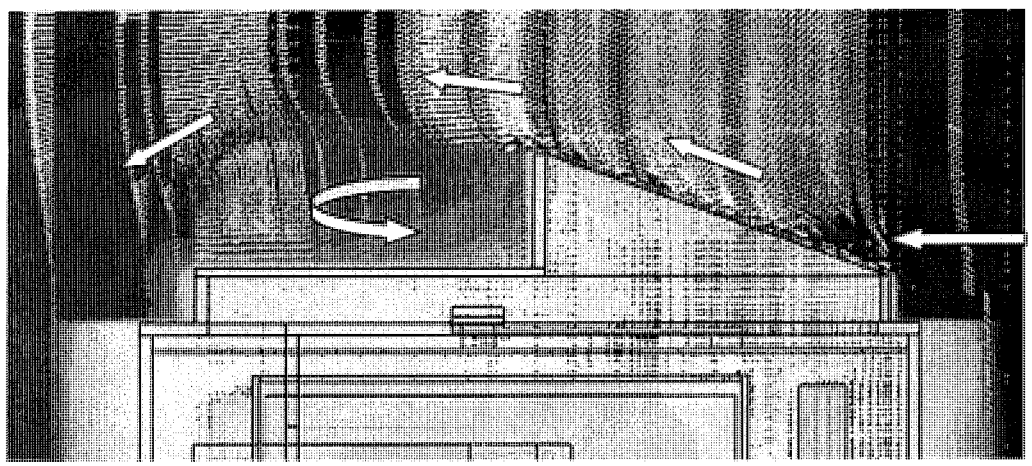
FIG. 4 is a view showing results of analysis of a direction and a speed of the air flowing around the electronic component casing.

FIG. 4 is a view showing results of analysis of a direction and a speed of the air flowing around the electronic component casing.

Referring to FIG. 4, the air flows along the inclined portion 21 of the lid 20 from the front toward the rear of the vehicle. This air flow is a laminar flow. The air cannot follow the sudden shape variation produced by the step portion, and therefore separates from the lid and turns in on itself, whereby the laminar flow becomes a turbulent flow.

Figure 5:
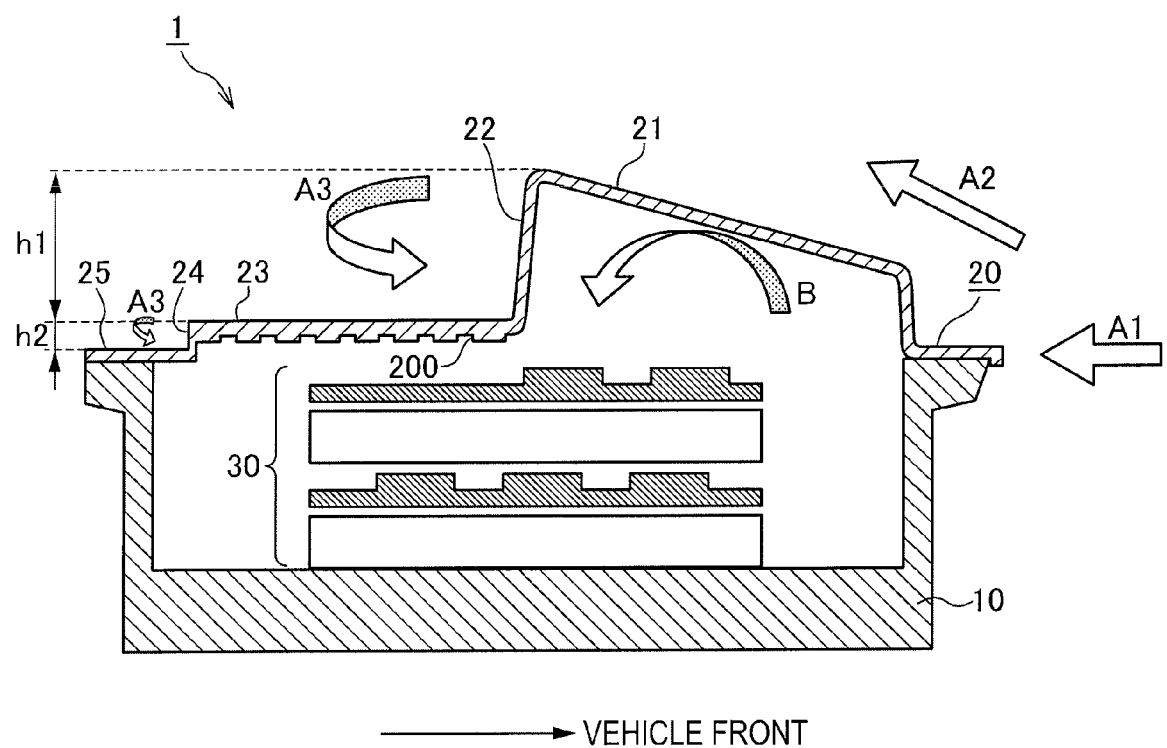
FIG. 5 is a distorted view showing the flow of air around the electronic component casing during vehicle travel.

FIG. 5 is a distorted view showing the flow of air around the electronic component casing during vehicle travel.

FIG. 5 shows the air flowing around the electronic component casing 1 as a distortion. In other words, the air flows around the electronic component casing 1 as shown in FIG. 5. More specifically, while the vehicle travels, the air flows through the engine room or the motor room from the front to the rear of the vehicle, as shown by an arrow A1, and then flows along the inclined portion 21 of the lid 20, as shown by an arrow A2. This air flow is a laminar flow. When the air reaches the long side 21*b* of the inclined portion 21, the air cannot follow the sudden shape variation produced by the step portion 22, and therefore separates from the lid 20. The air then turns in on itself above the planar portion 23, as shown by an arrow A3, whereby the air flow changes from a laminar flow to a turbulent flow.

The air then flows further toward the vehicle rear from the planar portion 23. A momentum of the turbulent flow weakens as the air travels toward the rear, but an eddy is formed again on the reference plane 25 by the additional step portion 24, as shown by an arrow A3.

Next, actions and effects of the electronic component casing 1 will be described.

As described above, the electronic component 30 fixed to the bottom surface of the electronic component casing 1 generates heat. Air warmed by this heat rises, and therefore accumulates easily in the space between the lid 20 and the electronic component 30, in particular on the rear side of the inclined portion 21 of the lid 20. Heat is drawn from this air by the air flowing as shown by the arrow A2. The air falls after being cooled in this manner. As a result, convection occurs between the inclined portion 21 of the lid 20 and the electronic component 30, as shown by an arrow B. A sufficient space is secured between the inclined portion 21 and the electronic component 30, and therefore convection occurs smoothly. Hence, temperature increases in sites positioned above the electronic component 30, which are likely to reach high temperatures, are suppressed.

Further, the air that forms a turbulent flow, as shown by the arrow A3, vigorously switches places with air in the vicinity of the step portion 22 and a front surface of the planar portion 23.

In other words, the laminar flow is a regular flow having a uniform flow speed and a uniform direction. When a laminar flow flows along a surface of an object, a boundary layer having a low flow speed is generated by an action of a drag of the object. Therefore, the air of the laminar flow does not switch places vigorously in the vicinity of the surface of the object. A turbulent flow, on the other hand, includes turbulence such as an eddy in which respective small parts of the fluid intermix irregularly. Hence, when a turbulent flow flows along the surface of the object, the air switches places vigorously in the vicinity of the surface of the object due to the turbulence.

Hence, heat is discharged easily from the step portion 22 and the planar portion 23. The irregularities 200 are formed on the rear side of the planar portion 23 of the electronic component 30. The irregularities 200 increase a surface area contacted by the air that is warmed by the heat generated from the electronic component 30. Therefore, the heat of the warmed air is transferred to the lid 20 easily. The planar portion 23 in particular has a low position and is therefore close to the electronic component 30 serving as a heat generation source. Heat is transferred more easily as a temperature difference thereof increases, and therefore the planar portion 23 close to the electronic component 30 serving as the heat generation source transfers heat easily. Hence, by forming the irregularities 200 on the rear side of the planar portion 23, the heat generated from the electronic component 30 is transferred easily to the front surface of the planar portion 23. As described above, a turbulent flow flows over the front surface of the planar portion 23, and therefore an extremely favorably heat radiation effect is obtained.

Figure 6:
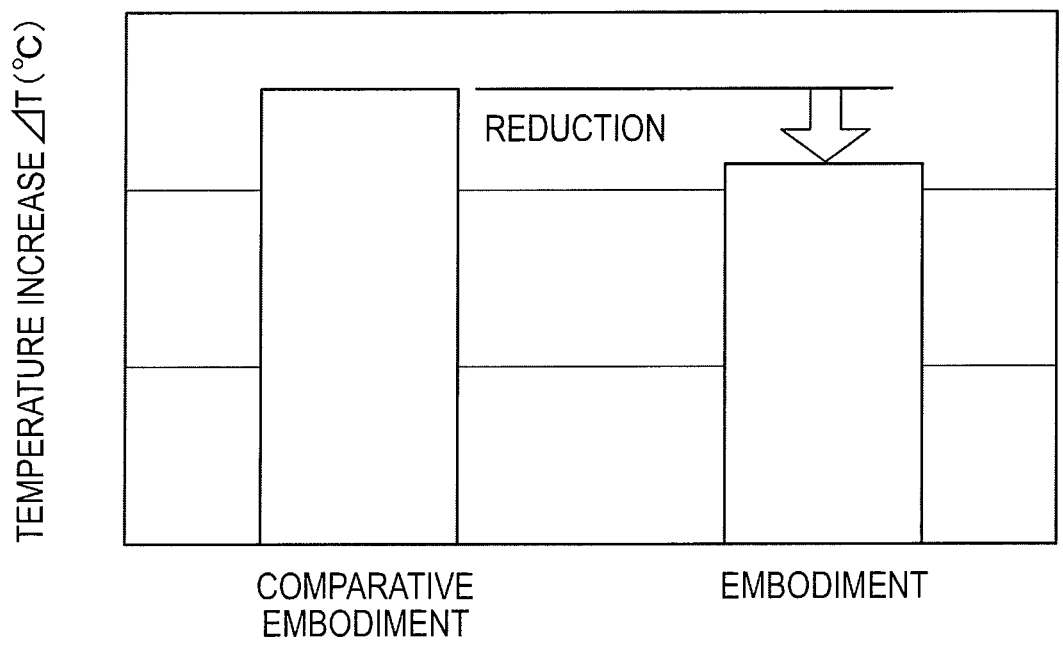
FIG. 6 is a view illustrating effects obtained in this embodiment.

FIG. 6 is a view illustrating effects of this embodiment.

As described above, in this embodiment, the inclined portion 21 and the planar portion 23 are formed on the upper surface of the lid 20. In a comparative embodiment, however, the inclined portion 21 and the planar portion 23 are not formed on the upper surface of the lid 20, and the reference plane 25 is provided alone such that the upper surface is flat.

When temperature variation in the interior of the electronic component casing 1 is observed under normal envisaged travel conditions (vehicle speed, outside air temperature, and so on), it is evident that temperature increases can be suppressed further by this embodiment than by the comparative embodiment.

Hence, according to this embodiment, the inclined portion 21 is formed on the lid 20 of the electronic component casing 1, and therefore the air flowing through the engine room or the motor room impinges directly on the inclined portion 21. Accordingly, heat is discharged easily from the front surface of the inclined portion 21 of the lid 20 so that the temperature of the front surface of the inclined portion 21 is reduced, leading to an improvement in heat transfer efficiency. As a result, heat radiation from the inclined portion 21 of the lid 20 into outside air is promoted.

The air flow changes from a laminar flow into a turbulent flow on the step portion 22 of the lid 20. Accordingly, the air flowing as shown by the arrow A3 switches places with the air in the vicinity of the step portion 22 and the front surface of the planar portion 23 vigorously, and as a result, heat radiation from the step portion 22 and the planar portion 23 is promoted. Heat is transferred more easily as the temperature difference thereof increases, and therefore the heat transfer efficiency of the step portion 22 and the planar portion 23 improves as the heat radiation effect of the step portion 22 and the planar portion 23 increases.

The turbulent flow flowing along the planar portion 23 gradually weakens, but an eddy is formed again on the reference plane 25 by the additional step portion 24, as shown by the arrow A3. Therefore, the lid 20 of the electronic component casing 1 exhibits a heat radiation effect over its entire length.

Furthermore, in this embodiment, the height h1 of the step portion 22 is greater than the height h2 of the additional step portion 24. In other words, "h1>h2" is established. The reason for this is as follows. A space for forming an eddy is secured more reliably as the height of the step portion increases, and therefore a turbulent flow can be generated more easily. The turbulent flow improves the heat radiation effect of the electronic component casing 1. The step is therefore preferably as large as possible. However, a large number of components exist in the engine room or motor room, and a large number of components also exist on the periphery of the electronic component casing 1. An overall height of the electronic component casing 1 is limited by a layout of the peripheral components. Therefore the size of the step is also limited. Hence, in this embodiment, "h1>h2" is established within these limitations. In so doing, a larger turbulent flow can be generated to the rear of the step portion 22 than when "h1<h2". As a result, the heat radiation effect of the electronic component casing 1 is improved.

Further, by establishing "h1>h2", a large space is secured above the electronic component 30 up to the inclined portion 21 of the lid 20. Heat rises upward, and therefore components positioned in an upper portion of the electronic component 30 are more likely to reach high temperatures. In this embodiment, however, a large space is secured above the electronic component 30, and therefore heat can escape easily. Further, by securing a large space above the electronic component 30, warmed air is cooled easily by the inclined portion 21 such that the convection shown by the arrow B occurs smoothly. By preventing a temperature increase in the electronic component 30 in this manner, a lifespan of the component can be extended. Moreover, an output performance of the component can be improved and a size of the component can be reduced. As a result, the electronic component casing 1 can also be reduced in size, leading to an improvement in space efficiency in the engine room or motor room.

The planar portion 23 is formed on a lower side of the step portion 22. The reference plane 25 is formed on a lower side of the additional step portion 24. By forming the lower sides of the respective step portions to be flat, a space for generating an eddy can be secured, and therefore eddies can be generated reliably to the rear of the step portions.

Further, the irregularities 200 are formed on the rear side of the planar portion 23 of the lid 20, and therefore the surface area contacted by the air that is warmed by the electronic component 30 increases. Accordingly, the heat of the warmed air is transferred to the lid 20 easily. The planar portion 23 in particular has a low position and is therefore close to the electronic component 30 serving as the heat generation source. Heat is transferred more easily as the temperature difference thereof increases, and therefore the planar portion 23 close to the electronic component 30 serving as the heat generation source transfers heat easily. Hence, by forming the irregularities 200 on the rear side of the planar portion 23, the heat generated from the electronic component 30 is transferred easily to the front surface of the planar portion 23. As described above, a turbulent flow flows over the front surface of the planar portion 23, and therefore an extremely favorably heat radiation effect is obtained. It should be noted that the irregularities 200 are not limited to the rear side of the planar portion 23, and may also be formed on a rear side of the inclined portion 21, whereby a further improvement in the heat radiation effect is obtained.

(Second Embodiment)

Figure 7:
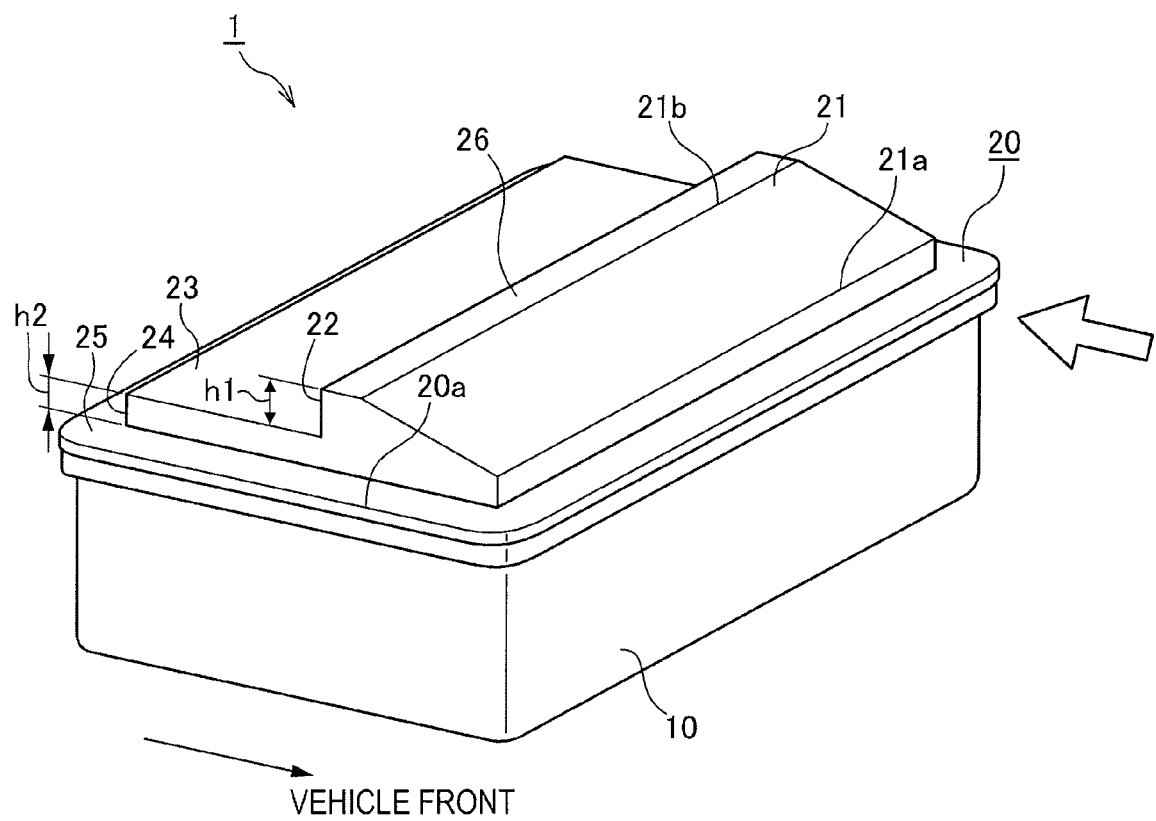
FIG. 7 is a perspective view showing a second embodiment of the electronic component casing according to this invention.

FIG. 7 is a perspective view showing a second embodiment of the electronic component casing according to this invention.

It should be noted that in the following description, parts having similar functions to the content described above have been allocated identical reference symbols, and where appropriate, duplicate description thereof has been omitted.

In the first embodiment, the step portion 22 is formed to descend as a continuation of the long side 21b of the upper end of the inclined portion 21. In this embodiment, the step portion 22 is formed to descend via a plane 26 connected to the long side 21b of the upper end of the inclined portion 21.

According to this embodiment, as long as the height of the step portion is not changed, an identical space for forming an eddy is secured to the rear of the step portion. Therefore, similar effects to the first embodiment are obtained.

(Third Embodiment)

Figure 8:
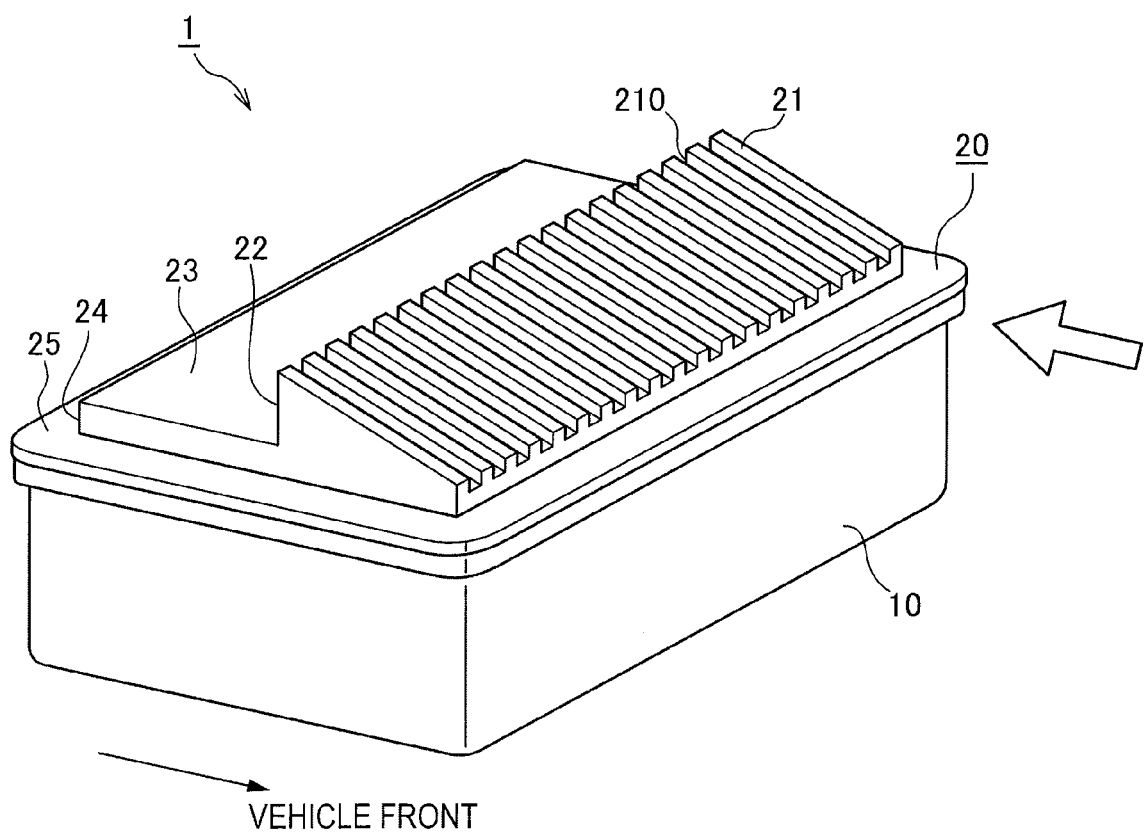
FIG. 8 is a perspective view showing a third embodiment of the electronic component casing according to this invention.

FIG. 8 is a perspective view showing a third embodiment of the electronic component casing according to this invention.

In this embodiment, irregularities 210 are formed on the front surface of the inclined portion 21 of the lid 20. The irregularities 210 are formed over the entire region of the front surface of the inclined portion 21 in alignment with a direction in which a traveling wind flows along the inclined portion 21 from an upstream side to a downstream side.

According to this embodiment, a surface area by which the inclined portion 21 of the lid 20 contacts the outside air, or in other words a heat radiation surface area, is increased, and therefore heat radiation from the inclined portion 21 of the lid 20 to the outside air is promoted even further.

(Fourth Embodiment)

Figure 9:
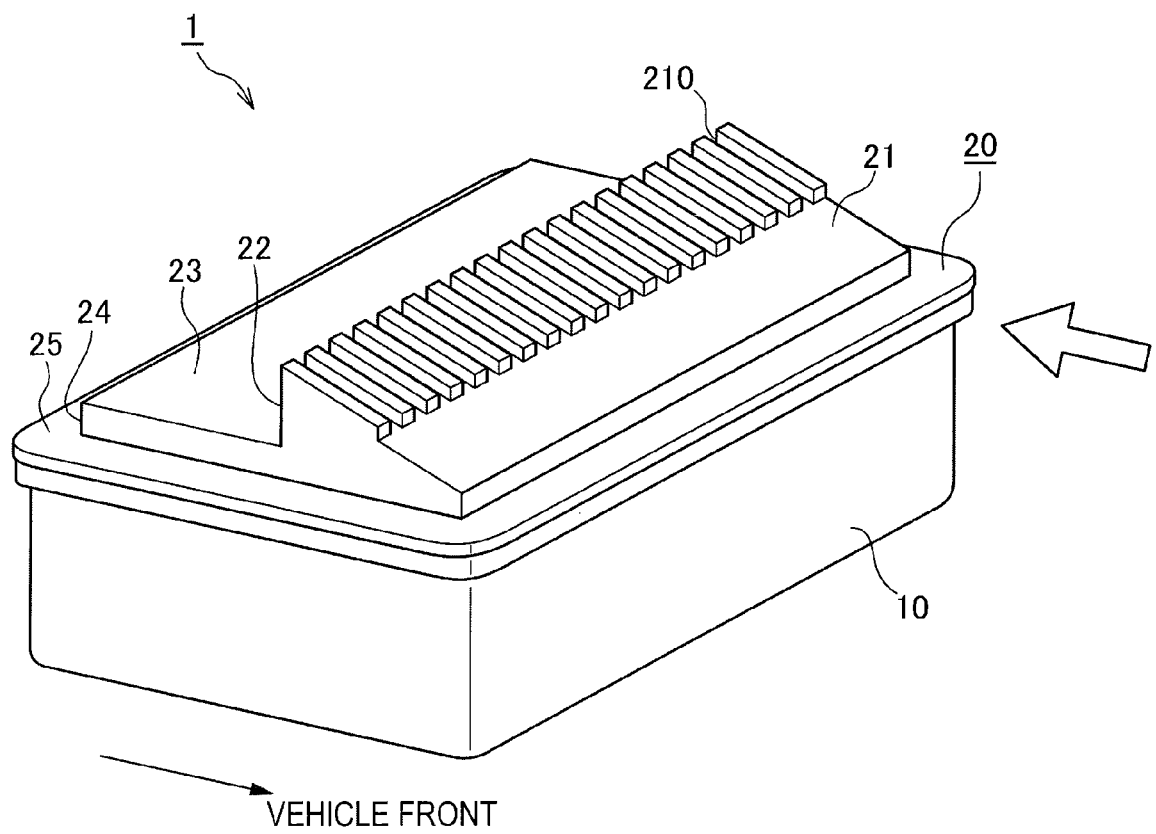
FIG. 9 is a perspective view showing a fourth embodiment of the electronic component casing according to this invention.

FIG. 9 is a perspective view showing a fourth embodiment of the electronic component casing according to this invention.

In this embodiment, the irregularities 210 are formed in a part of the front surface of the inclined portion 21 of the lid 20. In other words, the irregularities 210 are formed over a part of the entire region of the inclined portion 21 in alignment with the direction in which the traveling wind flows along the inclined portion 21 from the upstream side to the downstream side. In FIG. 9, the irregularities 210 are formed in half the region of the inclined portion 21 from the long side 21b of the upper end of the inclined portion 21.

Likewise with this embodiment, the heat radiation surface area increases in comparison with the first embodiment, and therefore heat radiation from the inclined portion 21 of the lid 20 to the outside air is promoted.

Due to natural convection in the interior of the electronic component casing 1, a highest location has the highest temperature. In other words, in this embodiment, the vicinity of the long side 21b of the upper end of the inclined portion 21 has the highest temperature. In this embodiment, the irregularities 210 are formed in this location, and therefore favorable heat radiation efficiency is achieved. Further, the irregularities 210 are smaller than when formed over the entire length of the inclined portion 21 of the lid 20, and therefore clearance relative to peripheral components is secured easily. As a result, heat radiation from the inclined portion 21 of the lid 20 to the outside air is promoted efficiently.

(Fifth Embodiment)

Figure 10:
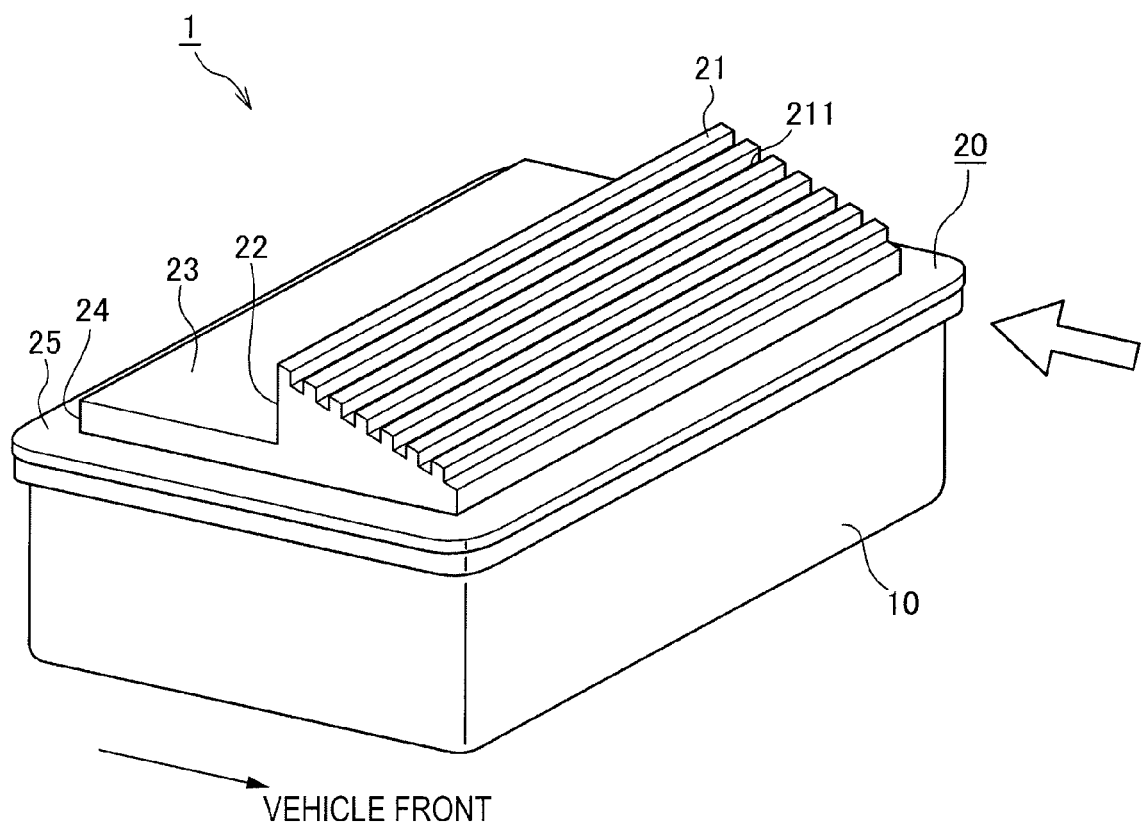
FIG. 10 is a perspective view showing a fifth embodiment of the electronic component casing according to this invention.

FIG. 10 is a perspective view showing a fifth embodiment of the electronic component casing according to this invention.

In this embodiment, irregularities 211 are formed on the front surface of the inclined portion 21 of the lid 20. The irregularities 211 are formed over the entire region of the front surface of the inclined portion 21 so as to be orthogonal to the direction in which the traveling wind flows along the inclined portion 21 from the upstream side to the downstream side.

Likewise with this embodiment, the surface area by which the inclined portion 21 of the lid 20 contacts the outside air, or in other words the heat radiation surface area, increases, and therefore heat radiation from the inclined portion 21 of the lid 20 to the outside air is promoted.

Further, since the irregularities 211 according to this embodiment are orthogonal to the flow of the traveling wind, a large number of small step portions are formed in the inclined portion 21 of the lid 20. As a result, fine eddies are formed by the irregularities 211 such that a turbulent flow is generated, and therefore the heat radiation effect is improved by the irregular front surface.

(Sixth Embodiment)

Figure 11:
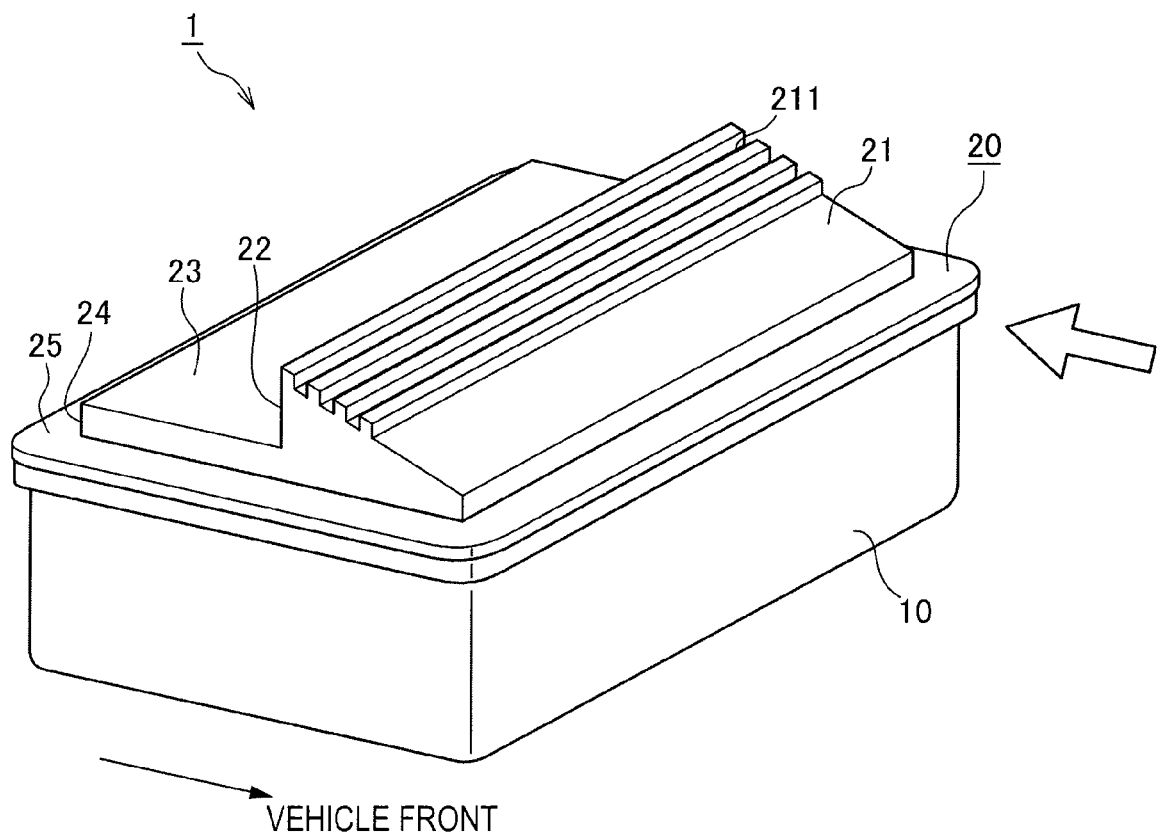
FIG. 11 is a perspective view showing a sixth embodiment of the electronic component casing according to this invention.

FIG. 11 is a perspective view showing a sixth embodiment of the electronic component casing according to this invention.

In this embodiment, the irregularities 211 are formed in a part of the front surface of the inclined portion 21 of the lid 20. In other words, the irregularities 210 are formed over a part of the entire region of the inclined portion 21 in alignment with the direction in which the traveling wind flows along the inclined portion 21 from the upstream side to the downstream side. In FIG. 9, the irregularities 210 are formed in half the region of the inclined portion 21 from the long side 21b of the upper end of the inclined portion 21.

Likewise with this embodiment, the heat radiation surface area increases in comparison with the first embodiment, and therefore heat radiation from the inclined portion 21 of the lid 20 to the outside air is promoted.

Further, the irregularities 211 are formed in the vicinity of the long side 21b of the upper end of the inclined portion 21, which has the highest temperature, and therefore favorable heat radiation efficiency is achieved. Moreover, the irregularities 211 are smaller than when formed over the entire length of the inclined portion 21 of the lid 20, and therefore clearance relative to peripheral components is secured easily. As a result, heat radiation from the inclined portion 21 of the lid 20 to the outside air is promoted efficiently.

Embodiments of this invention were described above, but the above embodiments merely illustrate a part of examples of application of the invention, and the technical scope of this invention is not limited to the specific configurations described in the above embodiments.

For example, the electronic component casing is formed from an aluminum alloy die cast material, but is not limited thereto, and may be formed from iron, copper, magnesium, and so on. Further, the electronic component casing may be formed by pressing or molding. Moreover, side faces of the casing case may be formed as separate members (from resin, steel plate, or the like).

Furthermore, in the above embodiments, the electronic component casing includes a case and a lid closing an upper portion of the case. The inclined portion 21, the planar portion 23, and the reference plane 25 are included on the upper surface of the lid. However, the electronic component casing is not limited to this shape. For example, the electronic component casing may be a casing in which the case and the lid according to the above embodiments are molded integrally. In this case, an opening/closing door may be provided in a bottom or a side portion of the casing, and the electronic component may be accommodated through the door. In other words, this invention is not limited to the lid of the electronic component casing, and similar effects are obtained as long as the upper surface is formed as described above.

Furthermore, in the embodiments, irregularities are provided in the front surface of the inclined portion of the lid, but the irregularities may be provided in another surface of the lid.

The present application claims a priority based on Japanese Patent Application No. 2010-117472 filed with the Japan Patent Office on May 21, 2010, all the contents of which are hereby incorporated by reference.

The invention claimed is:

1. An electronic component casing structured to house an electronic component, comprising:
    an inclined portion that projects from an upper surface so as to increase in height gradually from one side;
    a step portion that descends as a continuation of an upper end of the inclined portion or descends via a plane connected to the upper end; and
    a planar portion connected to a lower end of the step portion so as to reach a surface that extends to a peripheral edge of the upper surface,
    wherein an internal space is secured from a rear side of the inclined portion to the electronic component.

2. The electronic component casing as defined in claim 1, further comprising an additional step portion that descends from the planar portion.

3. The electronic component casing as defined in claim 2, wherein a step of the step portion is larger than a step of the additional step portion.

4. The electronic component casing as defined in claim 1, further comprising an irregularity provided on a front surface of the inclined portion orthogonal to the side.

5. The electronic component casing as defined in claim 1, further comprising an irregularity provided on a front surface of the inclined portion parallel to the side.

6. The electronic component casing as defined in claim 4, wherein the irregularity is provided in at least a part of a region of the front surface of the inclined portion that is connected to the upper end.

7. The electronic component casing as defined in claim 1, further comprising an irregularity provided on a rear side of the upper surface.

8. The electronic component casing as defined in claim 1, wherein the electronic component casing is installed in a vehicle such that the side of the inclined portion is positioned on a front of the vehicle.

* * * * *